United States Patent [19]

Ashwell

[11] Patent Number: 4,731,346

[45] Date of Patent: Mar. 15, 1988

[54] HETEROGENEOUS CONFORMAL CVD OF ARSENOSILICATE GLASS

[75] Inventor: Gareth W. B. Ashwell, Ipswich, England

[73] Assignee: British Telecommunications Public Limited Company, London, England

[21] Appl. No.: 691,819

[22] Filed: Jan. 16, 1985

[30] Foreign Application Priority Data

Jan. 18, 1984 [GB] United Kingdom ............... 8401250

[51] Int. Cl.$^4$ ................... H01L 29/167; H01L 29/78; H01L 21/95
[52] U.S. Cl. .................................. 437/240; 437/228; 437/982; 437/187; 437/275; 357/54; 357/63
[58] Field of Search ................... 148/1.5, 174; 357/52, 357/54, 63; 427/85, 93, 95

[56] References Cited

U.S. PATENT DOCUMENTS

| 4,319,260 | 3/1982 | Tasch, Jr. et al. | 148/187 |
| 4,355,454 | 10/1982 | Tasch, Jr. | 29/571 |
| 4,535,528 | 8/1985 | Chen et al. | 148/1.5 |
| 4,548,671 | 10/1985 | Kosonocky et al. | 29/576 R |

FOREIGN PATENT DOCUMENTS 2035682 4/1983 United Kingdom .

OTHER PUBLICATIONS

Wilkes, "Low Pressure Processes in Chemical Vapour Deposition of Silicon Oxides", J. Crystal Growth, 70 (1984), pp. 271-279.
Kern et al., "Optimized Chemical Vapor Deposition of Borophosphosilicate Glass Films", RCA Review, vol. 46, Jun. 1985, pp. 117-153.
Middlehoek et al., "SiO$_2$ Deposition Using Mixtures of SiH$_4$, O$_2$ and A", CVD 5th Int. Conf., 1975, pp. 19-29.
Kern et al., "Advances in Deposition Processes for Passivation Films", J. Vac. Sci. Technol., vol. 14, No. 5, Sep./Oct. 1977, pp. 1082-1099.
Levin et al., "The Step Coverage of CVD SiO$_2$ Glass Films", Materials Letters, vol. 1, No. 1, Jun. 1982, pp. 29-32.
Mattson, "CVD Films for Interlayer Dielectrics", Solid State Technology, Jan. 1980, pp. 60-64.
Adams, "Plasma Planarization", Solid State Technology, Apr. 1981, pp. 178-181.
Kern, "Chemical Vapor Deposition Systems for Glass Passivation of Integrated Circuits", Solid State Technology, Dec. 1975, pp. 25-33.
Amick et al., "Chemical Vapor Deposition Techniques . . . ", 2nd Int. Conf. of Electrochem. Soc., 1970, pp. 551-570.
Ghondi, VLSI Fabrication Principles, Silicon and Gallium Arsenide, John Wiley and Sons, New York, 1983, pp. 424-427, 582-585.
Journal of the Electrochemical Society, vol. 120, No. 1, Jan. 1983, M. Chezzo et al., "Arsenic Glass Source Diffusion in Si and SiO$_2$", pp. 110-116.

Primary Examiner—Brian E. Hearn
Assistant Examiner—William Bunch
Attorney, Agent, or Firm—Nixon & Vanderhye

[57] ABSTRACT

The use of arsenosilicate glass (ASG) as a dielectric layer in semiconductors, and methods of producing arsenosilicate glasses as conformal coatings are described. The ASG coatings may be produced as the result of heterogeneous reactions involving silane, arsine and oxygen. In multilevel semiconductors ASG may be used over the polysilicon gates 3, over aluminum metallization 5 and second dielectric layer 6, and/or over second metallization 7.

13 Claims, 9 Drawing Figures

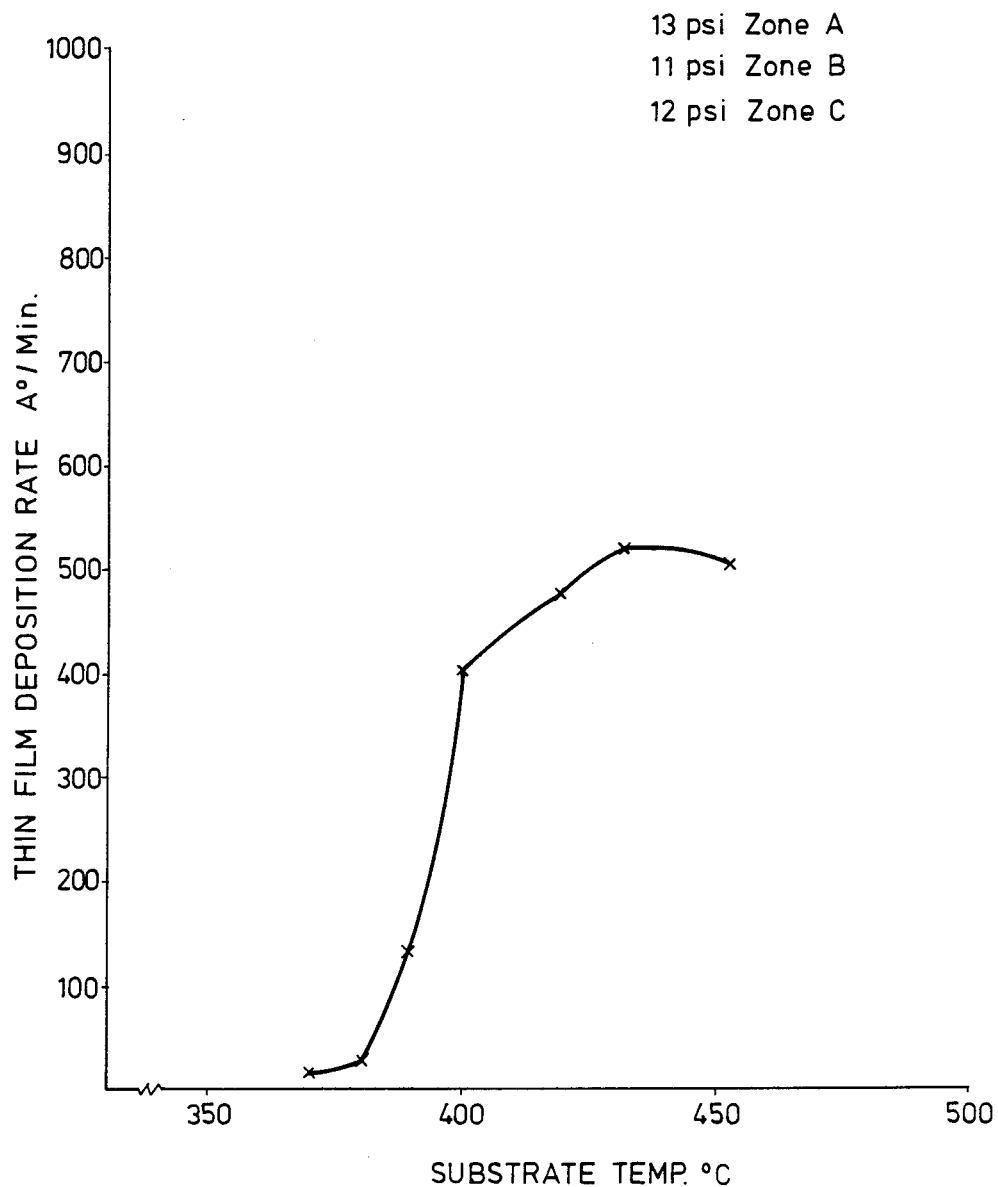

60

HETEROGENEOUS CONFORMAL CVD OF ARSENOSILICATE GLASS

This invention relates to semiconductor devices and to methods of fabricating them.

In the manufacture of integrated circuits and other semiconductors devices it is necessary to provide dielectric layers between the various conducting layers. In a typical integrated circuit, such as that shown in section in FIG. 1, there will be several dielectric layers, each of which may have a different composition. In the Figure, a silicon substrate 1 has been surface oxidised to provide a silicon dioxide (dielectric) layer 2 upon which polysilicon gates and interconnects 3 are produced. The first dielectric layer of interest 4 insulates the polysilicon features from subsequent features except at the points (contact windows) 9, 9' where it is removed to provide contact with a metallisation layer 5 which is next to be deposited. Following definition of the metallisation pattern, a second dielectric layer may be the final layer or, as in the example shown, may be followed by a further metallisation layer 7 interconnected with the first 5 by means of contact windows 9'' (usually referred to as vias in this position) as before. Following the last metallisation layer, a final dielectric layer 8 may be deposited and this serves to prevent the ingress of water and other contaminants and also resists surface scratching.

The compositions of the dielectric layers, particularly layers 4 and 6, are of interest. Layer 4 is generally a phosphorus doped silicon dioxide glass (PSG) film, but may be an undoped silicon dioxide glass (USG) film. These glass films, which are usually applied by chemical vapour deposition (CVD), are widely used in the microelectronics industry as dielectric layers between different conductor levels. Unfortunately, most of the glass deposition processes suffer from poor step coverage; that is, they provide poor coverage of vertical topographical features (such as gates and tracks etc.). This problem of step coverage is dealt with at length in the paper "The step coverage of undoped and phosphorus-doped SiO$_2$ glass films" by R. M. Levin and K. Evans Lutterodt, J. Vac. Sol. Technol. BI(1), January--March 1983 p. 54.

The basis for the CVD glass deposition processes is the reaction of silane and oxygen:

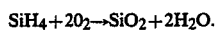

This is a homogeneous gas phase reaction: the product is formed in the gas phase and then condenses on any adjacent surface. The tendency is for the sides of any step to be sheltered by the upper part of the step and hence the product grows more rapidly on the upper part of the step. Lateral growth from the top corners of the step will screen the areas beneath it and thus the overhang will be self-perpetuating. If a metallisation layer is subsequently deposited onto the feature, the layer may become discontinuous below the overhang.

The problem of poor step coverage may be alleviated if phosphine gas is added to the reactants. Phosphine does not change the deposition mechanism, but it does add a few percent of phosphorus pentoxide to the silicon dioxide layer converting it to a phosphosilicate glass (PSG). This PSG has some advantages over USG:
(i) It melts at lower temperatures compatible with semiconductor processing, and if heated to about 1000° C. the glass will flow and surface tension will even out the overhang and the re-entrant to give smooth coverage;
(ii) the intrinsic stress in the film is lower;
(iii) the phosphorous atoms will getter any alkali ions that might otherwise penetrate the film.

The main disadvantage of this process is that phosphoric acid may be leached out of the layer to corrode the metallisation.

PSG is, however, not suitable for use as the second dielectric layer 6: the metallisation 5 is generally aluminium, and as can be seen from the figure it is in contact with elemental silicon in the contact windows 9, 9'; if the slice temperature is raised beyond about 570° C. an aluminium/silicon eutectic (M.P. 577° C.) will be formed with the resultant destruction of the device. This effect limits the deposition temperatures and subsequent processing temperatures for dielectric layers 6 and 8 to below 570° C. It is preferable, however, for the device temperature to be held below about 500° C. because solid-state reactions between aluminium and silicon begin to exert degrading effects in some devices at about 500° C. The only processes which can be used below this temperature are: (a) plasma enhanced deposition of silicon dioxide or silicon nitride; or (b) the deposition of polyimide resin. Plasma enhancement is relatively expensive, and there are problems with instability in devices produced using such processes. Polyimide is relatively cheap and simple to use, and is finding favour because of this. Dielectric layers 6 and 8 are therefore normally polyimide. There are, however, still some potential reliability and production problems with polyimide which have prevented universal acceptance.

Alternative reactions have been used in an effort to produce conformal coatings of silicon dioxide. Conformal coatings which do not suffer from the above mentioned step coverage problems, can be expected if homogeneous gas phase reactions are eliminated, and this is achieved in the following two reaction systems:

Both of these systems give conformal coatings, but as they are more stable the reactions only occur in the temperature range 650° to 950° C. This temperature can be reduced somewhat by introducing some of the energy required by means of a gas phase plasma. Unfortunately the equipment to produce suitable plasmas is very expensive and, furthermore, the plasma may introduce some electrical instabilities into any device produced in this way.

It can be seen from the above that there exists a need for a method of producing a conformal dielectric coating which can be carried out below 550° C. and preferably below 500° C. and which does not require the use of plasma equipment.

The present invention is based on our surprising discovery that it is possible to modify the silane/oxygen reaction by inhibiting the homogeneous gas phase reactions so that only the heterogeneous surface reactions occur, such that the resulting silicon dioxide based coatings are conformal and do not require heat treatment before metallisation, the reaction proceeding at temperatures below 500° C. without the use of a plasma.

The concept of inhibiting the gas phase reactions of a silane-oxygen mixture is not in itself new; the subject was first extensively investigated by H. J. Emeleus and K. Stewart in their paper "The oxidation of silicon hydrides" in J. Chem. Soc., p. 1182 (1935). In this paper they reported their study of the gas phase kinetics in which they found that several substances would inhibit the gas phase reactions; of the substances studied, ethylene was the most effective.

Middelhoek and Klinkhamer (fifth international conference of the Electrochemical Society, 1975, pp. 19-29) used the results obtained by Emeleus and Stewart and tried to inhibit the homogeneous reactions with ethylene. In their paper they indicate that ethylene is useful as an inhibitor of the homogeneous gas phase reactions.

However, in a more recent paper—RCA Review, Vol. 37, No. 1, March 1976, p.3-p.54—Kern, Schnable, and Fisher report that ethylene is effective as a selective inhibitant of the homogeneous reaction only at very low $O_2:SiH_4$ ratios—at ratios which they consider to be not normally usable for film deposition. Experiments (the results of which were confirmed in a private communication from Middelhoek to Kern) by Kern et al show that, at $O_2: SiH_4$ ratios more suited to film deposition; ethylene does not act as a selective inhibitant.

It is clear from the paper of Kern et al that selective suppression of the homogeneous reaction would be desirable to improve the quality of USG and PSG layers; however, no such suppressant is proposed.

We have made the surprising discovery that arsine acts much more effectively as an inhibitor in the silane-oxygen reaction than does ethylene, and that it is possible to produce a silicon dioxide-based arsenosilicate glass as a conformal coating.

Arsenosilicate glasses have found limited use in semiconductor device manufacture, but such use has principally been restricted to use as dopant sources. A typical example of such use can be found in PCT patent application No. WO 82/01380 of the NCR corporation, entitled "Process for forming a polysilicon gate integrated circuit device". In the NCR application an ASG layer is prepared by applying a solution of an arsenic-doped polymer in alcohol to the device, followed by spin coating to produce a uniform layer. The device is then baked to drive off the solvents to leave the ASG. This ASG layer is then photolithographically masked and etched to produce a masking layer for use during p-type doping. Subsequently the ASG mask acts as a doping source of n-type atoms.

Arsenic ions diffuse from the ASG layer (mask) into underlying silicon and polysilicon layers during a high temperature baking step to produce $n^+$ regions. Subsequently the ASG layer (mask) is completely removed by etching in hydrofluoric acid. The remaining processing steps, forming an oxide layer, vias, a metallisation layer, and a passivation layer, are conventional and of no interest here.

It can be seen that the NCR application, which concerns the use of an ASG layer as a combined mask and dopant source and which is to be removed before the device fabrication is complete, is very different to the present invention and is intended to solve problems which are very different to those to which the present invention is directed.

An exception to the general use of ASG as a dopant source is disclosed in U.S. Pat. No. 4,355,454 of Tasch et al which details use of an arsenic-doped glass as an insulating layer over polysilicon gates and interconnects. The ASG is deposited at about 500 degrees C. using silane, oxygen and arsine. After the arsenic doped layer is deposited it is heated to about 850 to 900 degrees C. to reflow the layer and give the surface of the slice a smoother topology. In devices having multilevel interconnects of polysilicon, as with those having only single level interconnects of polysilicon, the ASG is only deposited after the last layer of polysilicon has been deposited.

It is clear that Tasch et al failed to appreciate that it is possible to use arsine to control the silane oxygen reaction to produce conformal coatings of ASG. Nowhere is the reaction type referred to, and no mention is made of conformality—a property which would certainly have been mentioned if Tasch et al had produced it. In the processes described and claimed, the ASG is heated to reflow it; a step which would be unnecessary if the layer was conformal. Since reflowing involves heating to 850-900 degrees C. it is clear that such a process cannot be used to deposit arsenic-doped glass over metallisation layers.

According to a first aspect of the present invention there is provided a method of producing an arsenosilicate glass in a chemical vapour deposition process involving reactions between silane and oxygen, wherein reactions between silane and oxygen are predominantly of heterogeneous nature, such that the arsenosilicate glass is produced as a conformal coating.

According to a second aspect of the present invention there is provided a method of fabricating a semiconductor device comprising the step of producing a layer of arsenosilicate glass as a conformal coating, the arsenosilicate glass being produced in a chemical vapour deposition process wherein the reaction conditions are such that heterogeneous reactions between silane and oxygen are favoured over homogeneous reactions between silane and oxygen.

According to a third aspect of the present invention there is provided a semiconductor wafer incorporating a conformal coating of arsenosilicate glass.

According to the fourth aspect of the present invention there is provided a semiconductor device comprising one or more layers of arsenosilicate glass supported on a substrate wherein between at least one of the arsenosilicate glass layers and the substrate of the device there is a metallisation layer.

The invention will be further described by way of example only with reference to the accompanying drawings in which.

Figure 1:
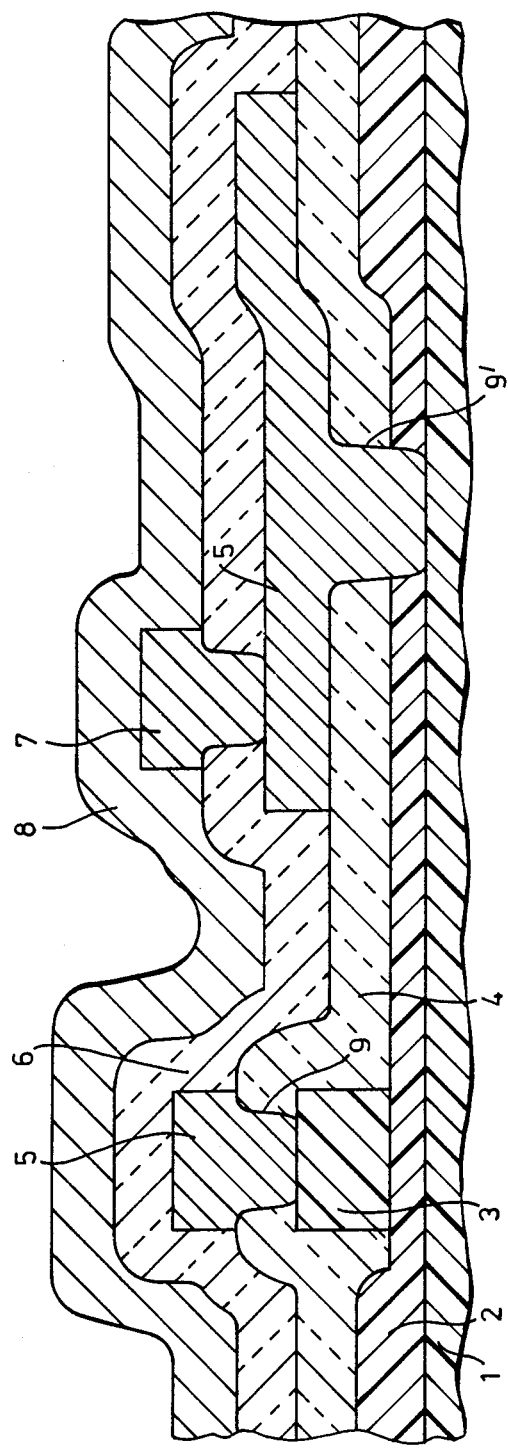
FIG. 1 shows a vertical section through a multi level integrated circuit device.

As has been previously explained, FIG. 1 is a vertical section through a typical multi-level integrated circuit. In known devices dielectric layers 4, 6, and 8 may be PSG, polyimide and polyimide, or layer 4 may be PSG and layers 6 and 8 plasma deposited silicon dioxide or silicon nitride. In devices according to the invention, any or all of layers 4, 6 and 8 may be ASG. Preferably at least the first (4) and second (6) dielectric layers are of ASG.

Figure 2:
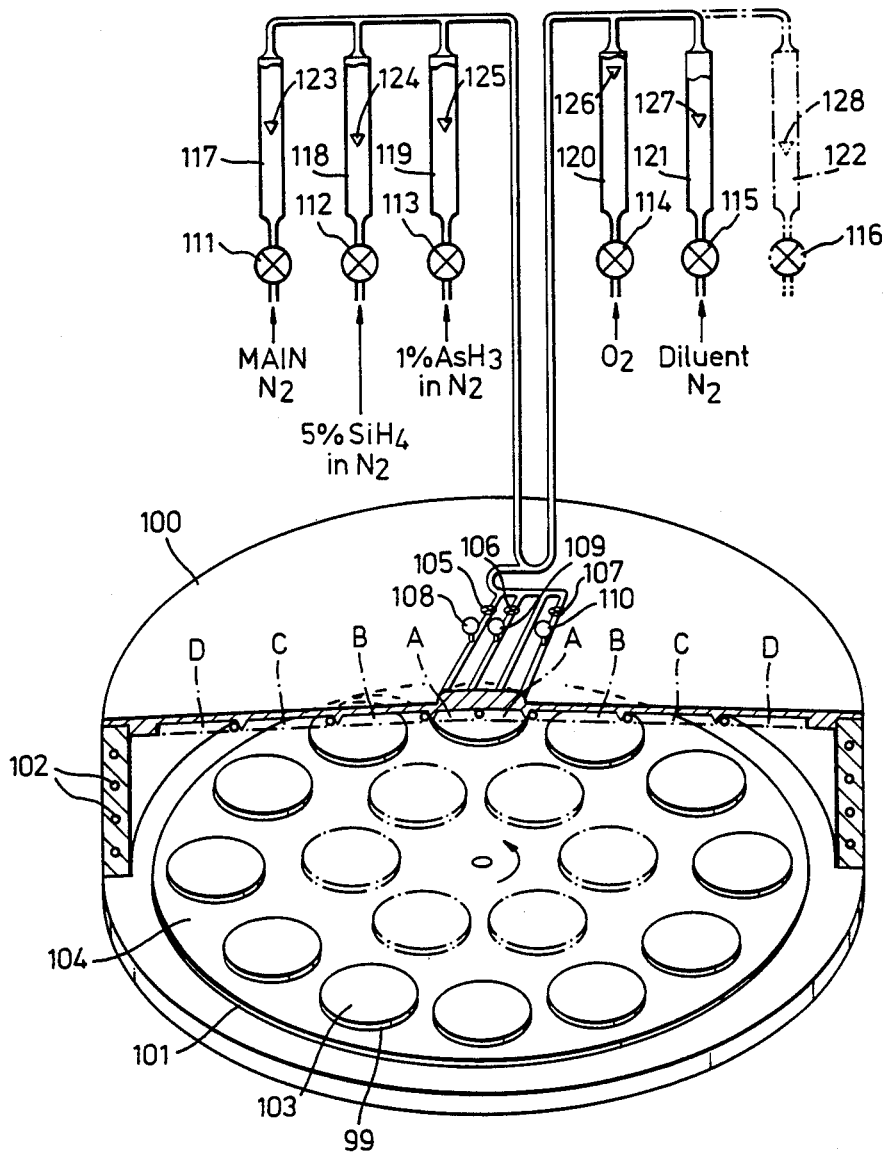
FIG. 2 is a diagrammatic representation of the apparatus used in the present invention.

The ASG is produced in a chemical vapour deposition (CVD) process such as may be carried out in a commercial CVD machine. Machines designed for the silane-oxygen reaction for CVD of silicon dioxide, such as the PYROX Reactor produced by Tempress-Unicorp, are particularly suitable for carrying out the ASG deposition, although other machines may also be suitable. For the purposes of description it will be assumed that a PYROX Reactor is to be used, and such a reactor is shown diagrammatically in FIG. 2.

The PYROX Reactor, which provides for batch processing of wafers, has a water cooled 102 reactor head 100 within which there is a rotatable circular table 101 upon which are placed wafers 103 to be treated. The table 101, which supports a graphite wafer carrier 104, is heated from underneath during processing, the temperature of the table 101 and hence of the wafers being measured by means of a thermocouple 98. In the experiments to be reported, three inch wafers were used. The wafers were held on silicon carbide coated graphite susceptors 99, arranged in a circle of twelve around the outer ring of an eighteen wafer carrier.

The reactor head consists of four concentric zones which, moving out from the centre, are termed A, B, C, and D. The gas flow to each of these zones can be adjusted to vary the conditions within the reactor head. Separate flow control valves 105, 106 and 107 and pressure gauges 108, 109, and 110 are provided for zones A, B, and C; flow to Zone D is not independently controllable. The composition of the gas fed to the reactor head can be adjusted by flow control valves 111–116 in each of six flowlines, the flowrates in each of the flowlines being monitored by means of rotameters 117–122, containing floats 123–128. In the present case, only five flowlines are required:

| Flowline Identity | Gas Composition | Rotameter Porter Model Number | Float Type |
|---|---|---|---|
| Main Nitrogen | N$_2$ | B250-8 | Stainless Steel |
| Silane | 5% SiH$_4$ in N$_2$ | B125-40 | " |
| Dopant 1 | 1% AsH$_3$ in N$_2$ | B125-40 | " |
| Oxygen | O$_2$ | B125-40 | " |
| Dilution Nitrogen | N$_2$ | B250-8 | " |

Throughout the experiments the zone pressures were maintained at values routinely used when depositing USG or PSG:

ZONE A—13 p.s.i.
ZONE B—11 p.s.i.
ZONE C—12 p.s.i.
ZONE D—not directly measurable.

Figure 3:
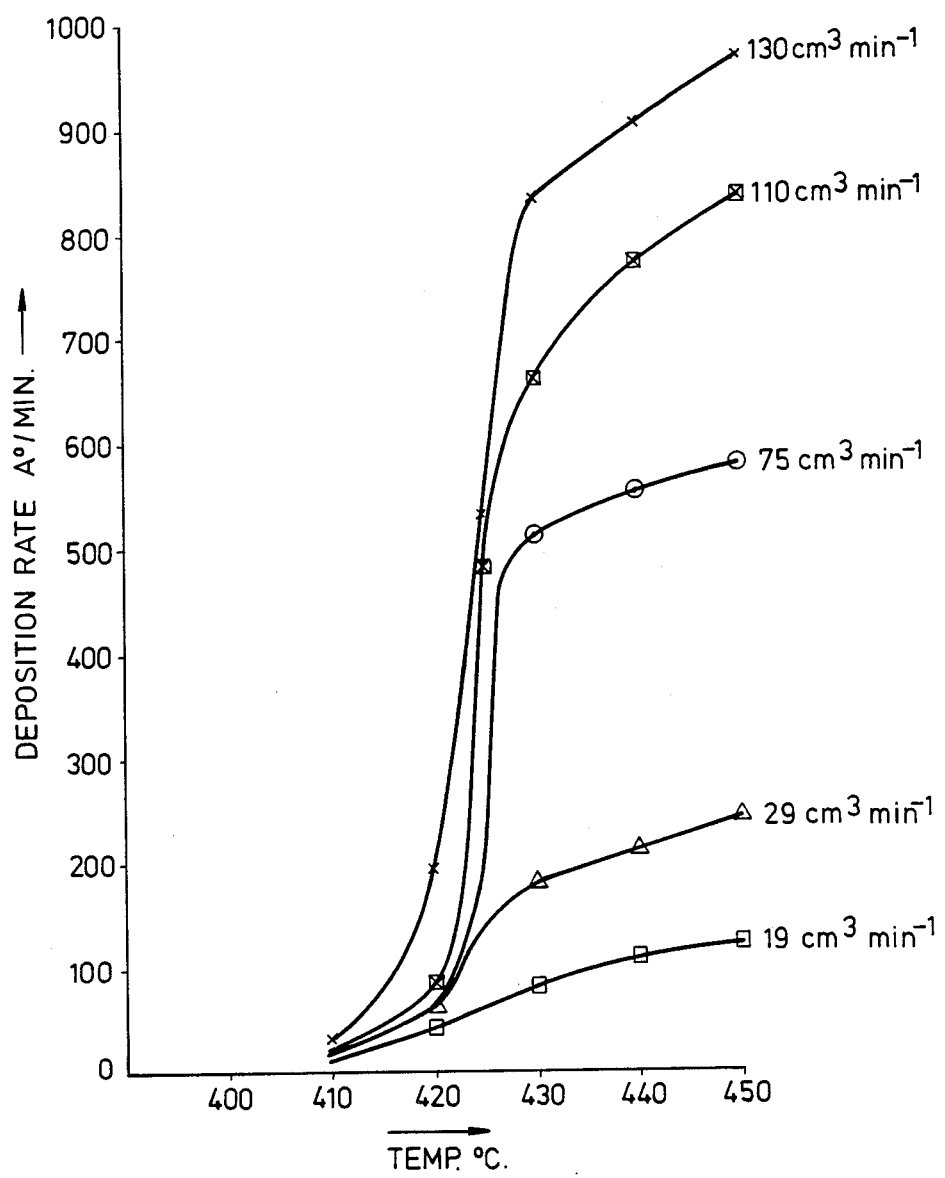
FIG. 3 is a graph showing how changes in the arsine-silane flow-rate affect the deposition rate with temperature.

Results for reactions carried out at plate (wafer) temperatures between 400 and 450 degrees C. are shown in FIG. 3. This figure shows how temperature affects the thin film deposition rate for five different total hydride flow rates (19, 29, 75, 110, 130 cc/minute) with the oxygen flow rate held constant at 2500 cc/minute, and with the main nitrogen and dilution nitrogen flow rates each held at 38 liters/minute.

Figure 4:
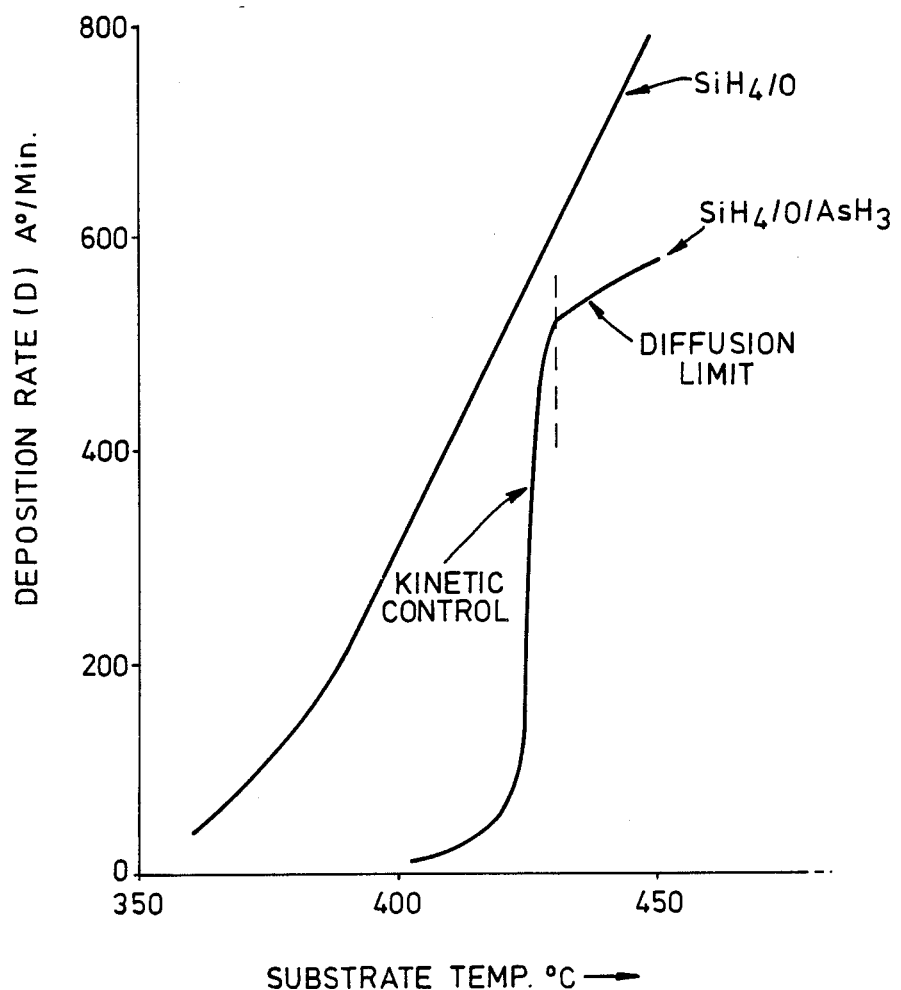
FIG. 4 is a graph of deposition rate against temperature for the silane-oxygen system and the silane-arsine-oxygen system.
Figure 5:
FIG. 5 is an SEM photograph showing a step covered by a conformal coating produced according to the invention.
Figure 6:
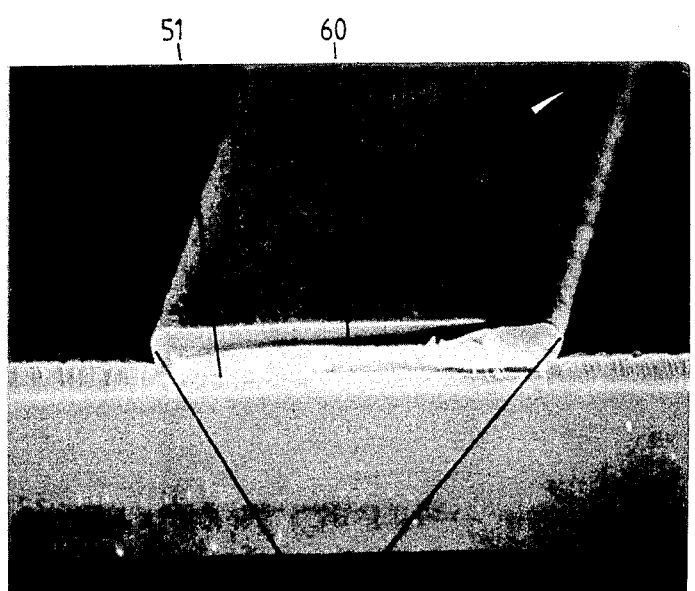
FIG. 6 is an SEM photograph showing poor step coverage.

It is instructive to compare the deposition vs. temperature curves obtained with silane-arsine-oxygen with those obtained with the silane-oxygen system. In FIG. 4 examples of each are compared. The curve for silane-arsine-oxygen (for 75 cc total hydride flow, SiH$_4$:Arsine ratio=61:14) shows the two regions which characterise it as a heterogeneous reaction. In the low temperature region, where there is kinetic control, the deposition rate shows the exponential rise with temperature predicted by the Arrhenius rate equation:

$$D = Ae^{-\frac{\Delta E}{KT}}$$

with some temperature variation of A (as predicted by the Eyring rate equation). In the second region (diffusion limit) the deposition rate is limited by the diffusion rate of the reactants through a very thin depleted zone near the surface which will follow the contours of the surface. By comparison, the silane and oxygen system shows a very small dependence of deposition rate on temperature (in the example illustrated it is practically constant at 9 Å per °C., which is small when compared to the 29 Å per °C. to 63 Å per °C. for the arsine-silane-oxygen example shown) and the lack of any diffusion limit indicates that it is a homogeneous gas phase reaction. The significance of the heterogeneous reaction is that the deposition rate is controlled by the surface temperature and not by the geometry of the surface, and hence one may expect such a reaction to give conformal oxide coatings. FIG. 5 shows such a conformal coating 50 of ASG over a 1 μm high aluminium track 51 with near vertical side walls 52. This should be compared with FIG. 6 which shows a typical non-conformal coating 60 produced as a result of a homogeneous reaction between silane and oxygen. The results of the homogeneous reaction can be seen as overhangs 61 at the sides of the track 51; such overhangs are typical of the non-conformal deposition which characterises homogeneous reactions.

The conformal coating of ASG as shown in FIG. 5 was produced with the instrument settings given in the following example:

EXAMPLE

| Gas | Rotameter reading height in mm |
|---|---|
| Main N$_2$ | 56 |
| 5% SiH$_4$ in N$_2$ | 40 |
| 1% A$_s$H$_3$ in N$_2$ | 44 |
| Dilution N$_2$ | 56 |
| Oxygen | 95 |
| This equals | 61 cc/minute of pure S:H$_4$ |
| | 14 cc/minute of pure A$_s$H$_3$ |
| | 2500 cc/minute of pure O$_2$ |

The zone pressures were maintained as above at 13 psi Zone A; 11 psi Zone B; 12 psi Zone C. Plate temperature=450° C. 3-inch silicon wafers placed in outer circle of an 18 wafer plate. Thin film deposition of rate of ASG=575 Å/minute. Glass deposited under these conditions was found to have an intrinsic stress of $5 \times 10^8$ Dynes cm$^{-2}$ tensile. The glass had a composition of 12 mol % As$_2$O$_3$, 88 mol % SiO$_2$.

Satisfactory conformal coatings have been produced with silane:arsine ratios between about 3.8:1 and 11.7:1. A deposition rate versus temperature curve for a silane flow rate of 60 cc minute$^{-1}$ and an arsine flow rate of 10 cc min$^{-1}$ (with 2500 cc min$^{-1}$O$_2$, main N$_2$=38 Liters min$^{-1}$, and dilution N$_2$=38 Liters min$^{-1}$) is shown in FIG. 3a.

It has been found that in general an increase in oxygen and/or silane concentration favours a homogeneous reaction and an increase in arsine concentration favours heterogeneous reaction.

The following gas mixtures, used under the conditions set out above, have been found to give the reaction type indicated:

| Run | Arsine ml/min | Silane ml/min | Oxygen l/min | Nitrogen l/min | Reaction |
| --- | --- | --- | --- | --- | --- |
| A | 6.5 | 61 | 1.4 | 76 | heterogeneous |
| B | 3.1 | 61 | 1.4 | 76 | homogeneous |
| C | 6.5 | 76 | 1.4 | 76 | heterogeneous |
| D | 6.5 | 113 | 1.4 | 76 | homogeneous |
| E | 6.5 | 148 | 1.4 | 76 | homogeneous |

The As$_2$O$_3$ content of the glasses produced under heterogeneous reaction conditions were as follows:
Run A 6% at 400° C., 4% at 450° C.
Run C 3% at 400° C., 2% at 450° C.

It is usual after producing the first dielectric layer 2, and before producing the contact windows 9', 9", to carry out a back gettering step to trap sodium and other undesirable ions which would otherwise adversely affect device performance and reliability. When the first dielectric layer 2 is of PSG, the gettering process involves heating the device in an atmosphere of phosphorus oxychloride (POCl$_3$) and oxygen to produce a layer of phosphorus pentoxide P$_2$O$_5$ about 400 Å thick on the entire surface of the slice. The P$_2$O$_5$ layer acts as a doping source of phosphorus atoms which heavily dope the back of the slice (the PSG and SiO$_2$ layers protecting the front of the slice) when it is heated to about 1000° C. This heavy doping damages the silicon lattice of the slice to form sites which act as traps for the unwanted ions which are mobile at this temperature. When the slice is cooled the unwanted ions are trapped in the sites to which they migrated during the heating step, which (because of the effects of the PSG and SiO$_2$ layers) are to the rear of the slice, well away from the front of the slice where the active regions are to be formed. The P$_2$O$_5$ layer is removed by etching in dilute HF after formation of the contact windows.

As this gettering step is normally an essential step in device manufacture, the first dielectric layer must be able to withstand the back gettering process. Evaluation of the thermal stability of the ASG layers produced according to the invention has shown that they are capable of undergoing the temperature cycling involved in back gettering without losing their integrity.

A surprising and beneficial side effect of the back gettering process is that in the etching step following gettering the ASG tends to develop a smoother topography. The result is equivalent to that observed when PSG or ASG which can be heat reflowed if it contains above about 7–10% As$_2$O$_3$) is reflowed by heating. This smoothing effect is advantageous because although a conformal coating will be free from overhangs, it will have steep sided features which may cause some difficulty during metallisation or subsequently (although any such difficulties will tend to be minimal compared to those found with a non-conformal non-reflowed layer). The 'reflowed' type of topography is generally free of steep sided features and has low step angles, which minimise problems both during metallisation and in subsequent processing.

It is believed that the following mechanism is responsible for the smoothing effect during etching. When the wafer is heated in the POCl$_3$ atmosphere for back gettering, phosphorus (as P$_2$O$_5$) diffuses into the dielectric layer, the amount which diffuses at any point being dependent upon the topography at that point. Where the surface of the wafer is convex, such as at the top corner of a step, the dielectric will have a large surface to volume ratio and the diffusing phosphorus atoms will tend to follow convergent paths. Conversely, where the wafer is concave, such as at the foot of a step, the dielectric will have a small surface to volume ratio and the diffusing phosphorus atoms will follow divergent paths. Consequently where the wafer is convex the dielectric will have a higher phosphorus content, while the concave parts will have a lower phosphorus content. Since the etch rate of ASG (and PSG) increases with increasing P$_2$O$_5$ content (and As$_2$O$_3$ content), the convex parts will etch faster than the concave parts, leading to a smoothing of the topography.

One further change noticed as a result of back gettering when using an ASG dielectric is that there is a depletion of the arsenic content in the surface region of the layer.

ASG layers produced as above have been found to have advantages other than just the ability to form conformal coatings at relatively low temperatures. In particular, it has been found that the etch properties of ASG are superior to those of PSG.

PSG is frequently used to form the first dielectric layer over the polysilicon gates and tracks of an integrated circuit, i.e., layer 4 over gates 3 of FIG. 1. Beneath layer 4 and gates 3 is a layer 2 of SiO$_2$ produced by surface oxidation of the substrate 1. When it is desired to form contact windows to the underlying silicon, as at 9' in FIG. 1, it is necessary to etch both the PSG and the SiO$_2$. Unfortunately, the etch rate of PSG is considerably greater than the etch rate of SiO$_2$, and this means that undercutting of the window in the PSG layer is a problem.

This is illustrated in FIG. 7. FIG. 7a shows the structure at the start of etching, with the contact window positions marked by holes 20 in a mask 21 which has been deposited over the PSG layer 4. As the etch dissolves the PSG the contact window 22 grows laterally and vertically. In FIG. 7b, which shows the situation at the instant that the etch has progressed vertically as far as the SiO$_2$ layer, it can be seen that the contact window 22 has spread widthwise dramatically to produce a very wide hole, the upper ends 23, 23' of which extend far beyond the edges of the hole 20 in the mask. In FIG. 7c which shows the situation after the SiO$_2$ has been etched, it can be seen that there has been considerably more lateral spread. Such a contact window is unacceptable for high density circuits as it would require the use of unacceptably wide tracks and interconnects. FIGS. 7d and 7e show how the problem is currently dealt with. In this process two etching steps are used to produce the contact windows. A first etch is used to reach the stage shown in FIG. 7b, i.e., formation of the via hole in the PSG. The first etch is stopped there, the first mask removed, and a second mask 25 applied over the PSG, FIG. 7d. This second mask 25 covers the sides of the via and protects the PSG from the second etch.

Figure 7A:
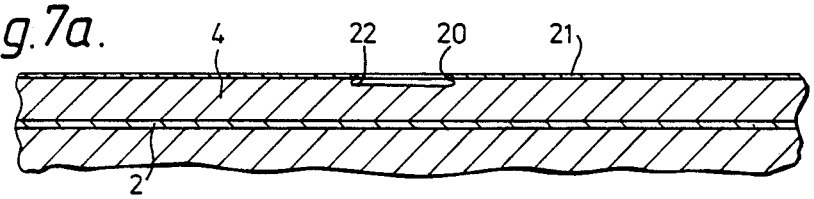
FIG. 7 shows the via formation process with PSG.
Figure 7B:
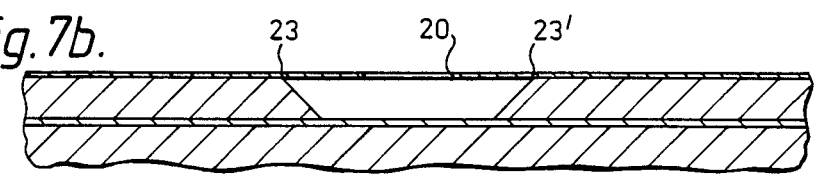
Figure 7C:
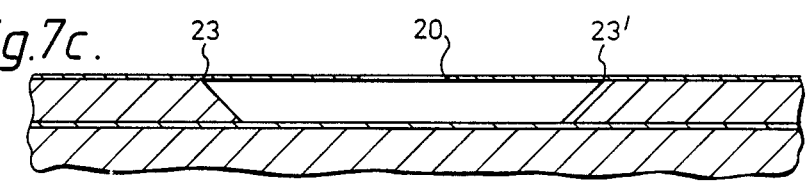
Figure 7D:
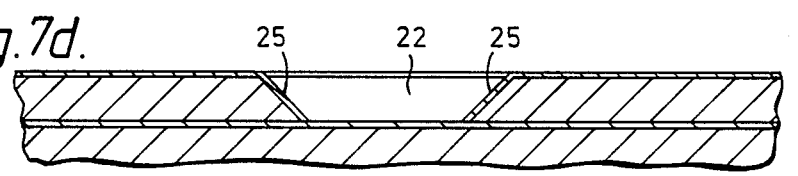
Figure 7E:
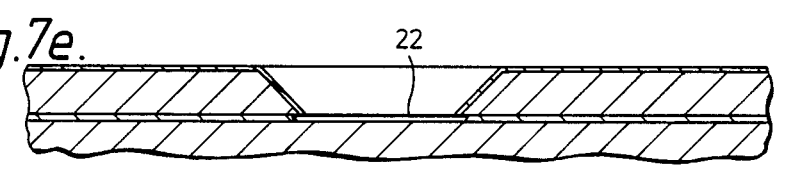

Following application of the second mask 25, the second etch is carried out; the resulting contact window is shown in FIG. 7e. This contact window, although not ideal, has very much less lateral spread than that shown in FIG. 7c, and is adequate for current high density circuits.

The contact windows produced in this way have basal diameters of up to about 4.5 μm-5 μm and are on the limit of what is acceptable for use with 3 μm track width geometry. It would be very desirable to be able to produce contact windows smaller than this. It would also be very desirable to produce contact windows without having to use a mask-etch-mask-etch process.

Figure 8A:
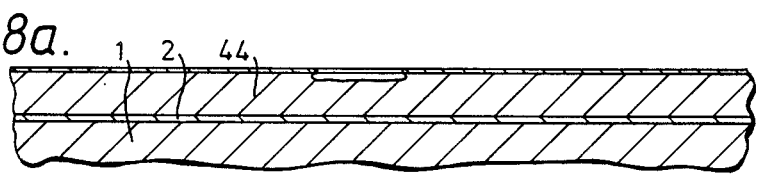
FIG. 8 shows the via formation process with ASG produced according to the invention.
Figure 8B:

FIG. 8a shows a device similar to that of FIG. 7a except that the PSG layer 4 has been replaced by an ASG layer 44. It has been found that the etch rate of ASG (at least for ASG deposited according to the invention) is very similar to that of $SiO_2$ layer 2. It is therefore possible to etch contact windows in a single etch step without serious undercutting. From FIG. 8b it can be seen that the contact window has only spread very slightly compared with FIG. 7c.

Figure 9A:
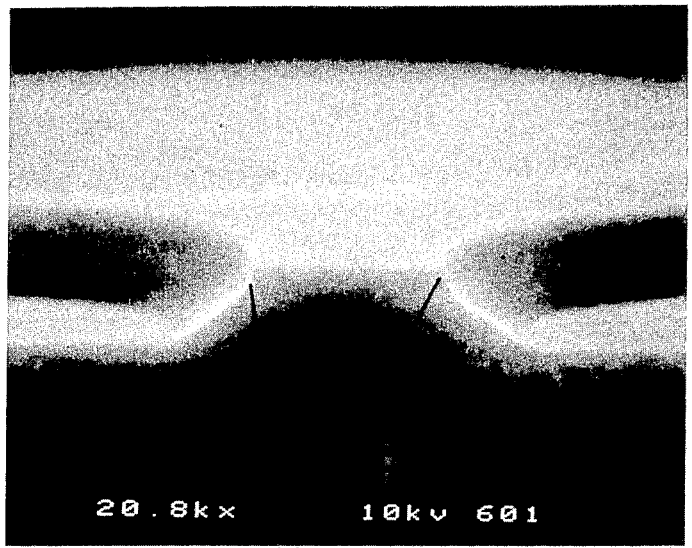
FIG. 9 is an SEM photograph showing contact windows produced in ASG according to the invention.

Contact windows produced in this way have been found to possess not only a good shape, but they are also generally of smaller size than those produced with PSG. Basal diameters have been of the order of 3.6–3.7 μm for windows produced in this single step process. FIG. 9a is an SEM photograph of such a contact window. It can be seen from FIGS. 8b and 9a that the contact window has a steeper slope (60 in FIG. 9a) in a region towards its upper edge. This slope is the result of the arsenic depleted surface region (produced during the above-mentioned back gettering process) etching more slowly than the bulk of the ASG. It has been found that this feature defines the window size more closely.

Figure 9B:
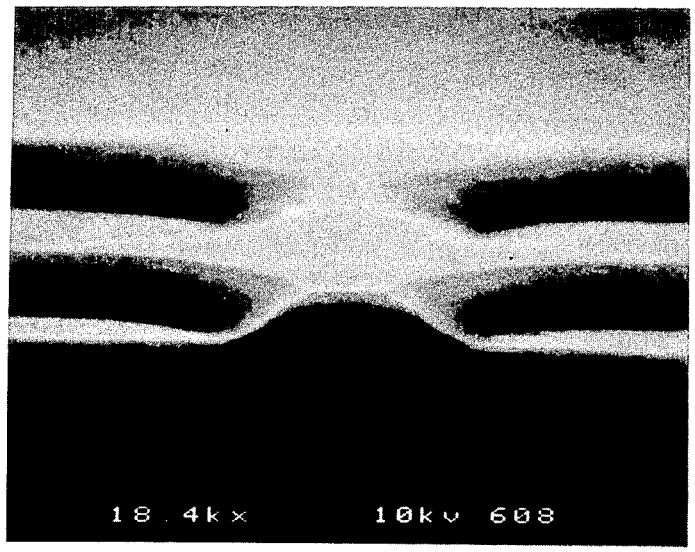

FIG. 9b is an SEM photograph of a contact window produced as above which has been etched to remove the $P_2O_5$ layer produced during the back gettering process. It can be seen that the edge profile of the contact window has been evened out. It has been found that metallisation of contact windows produced as above is particularly easy.

Although the invention has been described in relation to use on silicon wafers, its use is by no means limited to silicon—for example it should also find application on gallium arsenide, indium phosphide and other semiconductor materials.

Devices made using ASG as sub-metal dielectric have been found to have performance much the same as that found width equivalent devices made using PSG.

Using ASG over ASG instead of polyimide over PSG or plasma oxide over PSG appears to give dramatically improved reliability. In routine accelerated ageing tests carried out at 85° C. in 85% R.H. unprotected ASG over ASG chips showed no deterioration after 1000 hours. Equivalent constructions using polyimide over PSG last only 40 to 120 hours, as do devices using plasma oxide over PSG.

I claim:

1. A process for fabricating a semiconductor device having a conformal dielectric coating of arsenosilicate glass disposed over underlying material layers having a topography which includes abrupt changes in vertical elevation, said process comprising the steps of locating said semiconductor device with said underlying material layers within chemical vapor deposition apparatus;

maintaining the temperature of said device below about 500° C. while controllably admitting a gaseous mixture comprising $SiH_4$, $O_2$, $AsH_3$ and non-reactive diluent into the environment of said device wherein the volume ratio of silane to arsine lies in the range 3.8:1 to 11.7:1, with the volume ratio of oxygen to silane in the range of 18.5:1 to 41:1 so as to establish a predominantly heterogeneous deposition reaction onto the surface of said device and thereby achieve said conformal dielectric coating.

2. A process as in claim 1 wherein the temperature of said device is maintained between 400° C. and 450° C.

3. A process as in claim 1 further comprising the step of back gettering the device after producing the conformal arsenosilicate glass coating.

4. A process as in claim 1 wherein the arsenosilicate glass layer conformally overlies a metalization material layer on said device.

5. A process as in claim 1 further comprising the step of depositing a metalization layer over the conformal layer of arsenosilicate glass.

6. A process as in claim 5 further comprising the step of depositing an additional layer of arsenosilicate glass over the metalization layer by repeating said previously recited maintaining step.

7. In a process for depositing a layer of arsenosilicate glass onto an underlying substrate via a chemical vapor deposition process including supplying a gaseous mixture of silane, oxygen, arsine and a non-reactive diluent and reacting the gaseous mixture to deposit an arsenosilicate film onto the substrate, the improvement comprising:

(1) selectively adjusting the amount of arsine gas supplied to the gaseous mixture to control the silane/oxygen reaction and maintain a heterogeneous decomposition reaction onto the surface of the substrate substantially to the exclusion of a homogeneous reaction of silane and oxygen wherein the volume ratio of silane to arsine lies in the range 3.8:1 to 11.7:1, with the volume ratio of oxygen to silane in the range 18.5:1 to 41:1; and (2) depositing the arsenosilicate layer onto and in conformity with a substrate having a topography including abrupt changes in vertical elevation.

8. A method as claimed in claim 7 wherein the reaction is carried out at a temperature between 400° C. and 450° C.

9. A method as in claim 7 used in fabricating a semiconductor device, the method including the step of producing a layer of arsenosilicate glass as a conformal coating onto a semiconductor device then and thereafter maintained at temperatures less than about 500° C.

10. A method as claimed in claim 7, the method further comprising carrying out a back gettering step after the arsenosilicate glass is produced.

11. A method as claimed in claim 9 wherein the arsenosilicate glass lies over a metallisation layer.

12. A method as claimed in any one of claims 9, 10 or 11, the method further comprising the step of depositing a metallisation layer over the arsenosilicate glass.

13. A method as claimed in claim 12, the method further comprising the step of depositing an additional layer of arsenosilicate glass over the metallisation layer.

* * * * *